United States Patent
Freeman, Jr. et al.

(10) Patent No.: US 6,900,105 B2
(45) Date of Patent: May 31, 2005

(54) SEMICONDUCTOR DEVICE AND METHOD OF MANUFACTURE

(75) Inventors: John L. Freeman, Jr., Mesa, AZ (US); Raymond J. Balda, Tempe, AZ (US); Robert A. Pryor, Mesa, AZ (US); Joseph L. Petrucci, Jr., Dresden (DE); Robert J. Johnsen, Scottsdale, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 53 days.

(21) Appl. No.: 10/211,842

(22) Filed: Aug. 2, 2002

(65) Prior Publication Data

US 2002/0190351 A1 Dec. 19, 2002

Related U.S. Application Data

(63) Continuation of application No. 09/516,350, filed on Mar. 1, 2000, now abandoned.

(51) Int. Cl.⁷ .......................................... H01L 21/331
(52) U.S. Cl. .................... 438/361; 438/353; 438/357; 438/359; 438/360; 438/369
(58) Field of Search .................... 438/309, 317, 438/318, 322, 337, 341, 353–377, 205, 313, 340, 350; 257/477, 511, 525, 552, 565, 555, 557, 575, 205, 370, 348

(56) References Cited

U.S. PATENT DOCUMENTS

| | | | | |
|---|---|---|---|---|
| 5,101,256 A | * | 3/1992 | Harame et al. | 257/565 |
| 5,108,783 A | | 4/1992 | Tanigawa et al. | |
| 5,374,845 A | * | 12/1994 | Havemann | 257/592 |
| 5,480,815 A | * | 1/1996 | Watanabe | 438/365 |
| 5,796,157 A | * | 8/1998 | Fallico et al. | 257/557 |
| 5,798,561 A | * | 8/1998 | Sato | 257/588 |
| 5,982,022 A | * | 11/1999 | Violette | 257/592 |
| 6,064,106 A | * | 5/2000 | Shishido et al. | 257/513 |
| 6,156,594 A | | 12/2000 | Gris | |
| 6,265,747 B1 | | 7/2001 | Suzuki | |
| 6,287,930 B1 | * | 9/2001 | Park | 438/369 |
| 6,388,307 B1 | * | 5/2002 | Kondo et al. | 257/592 |

FOREIGN PATENT DOCUMENTS

JP  11-312687  11/1999

* cited by examiner

Primary Examiner—Ori Nadav

(57) ABSTRACT

In a semiconductor manufacturing method, an emitter region (211) and a base enhancement region (207) are formed to provide linear voltage, capacitance and low resistance characteristics. In the manufacturing method, a semiconductor device (200) is formed on a silicon substrate layer (101) with an epitaxial layer (203). Trenches (233) are cut into the epitaxial layer (203) and filled with oxide (601) to provide reduced junction capacitance and reduced base resistance. The emitter region (211) and the base enhancement region (207) are simultaneously formed through an anneal process.

1 Claim, 6 Drawing Sheets

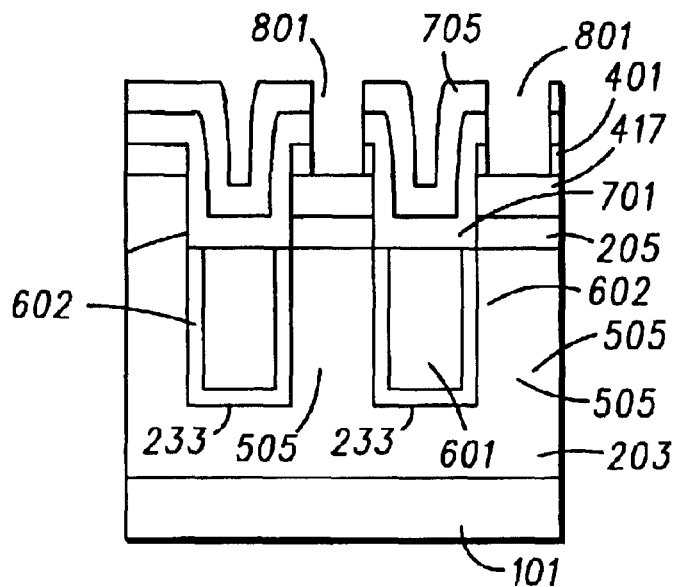
FIG. 8    200
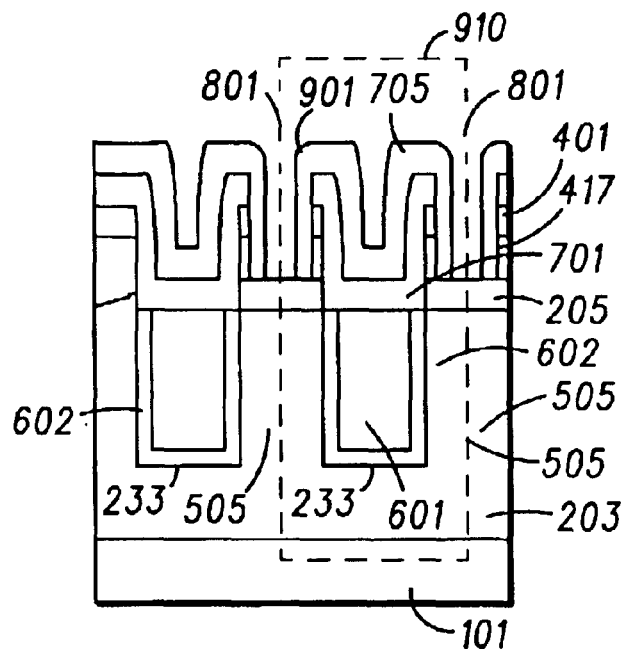
FIG. 9    200

SEMICONDUCTOR DEVICE AND METHOD OF MANUFACTURE

RELATED APPLICATION

This application is a continuation of application Ser. No. 09/516,350, filed Mar. 1, 2000, now abandoned.

FIELD OF THE INVENTION

The present invention relates to semiconductor devices, in general, and to a bipolar transistor and a manufacturing method thereof, in particular.

BACKGROUND OF THE INVENTION

Prior radio frequency (RF) bipolar technology devices utilize common base wells containing multiple emitter finger device structures. The frequency response of such devices is lithographically established by the emitter width. RF power gain, distortion figures, noise factor and efficiency are significantly impacted by the magnitude and linearity of the associated parasitic base-to-collector capacitance, base-to-emitter capacitance, and base resistance. These prior RF devices have excessive, nonlinear extrinsic base-to-collector capacitance and base resistance. To attain a very high speed for a junction bipolar transistor, it is necessary to diminish the base resistance, base-to-emitter capacitance and base-to-collector capacitance.

A common process for forming bipolar transistors includes the steps of doping an n-type silicon substrate layer that acts as a collector terminal with p-type dopant to form a base region. A layer of polysilicon is formed on the surface of the substrate layer to provide electrical contact to an emitter region and to the base region. The emitter region is formed by diffusing an n-type dopant from the layer of polysilicon into the base region in the substrate layer.

To enhance electrical contact to the base region, an additional base contact region is formed by diffusing a p-type dopant from the layer of polysilicon into the base region in the substrate layer. However, during subsequent high temperature processing, some of the p-type dopant used to form the base contact region migrates through the layer of polysilicon and gathers in the layer of polysilicon in the n-type emitter portion of the bipolar transistor. The lateral diffusion of the p-type dopant forms a minority carrier concentration gradient in the layer of polysilicon above the emitter region. The presence of this concentration gradient creates variability in the resistance of the emitter portion of the layer of polysilicon. This variability in resistance makes it more difficult to predict and control the exact performance characteristics of the bipolar transistor.

Conventional methods to compensate for this problem are directed towards increasing the gain (beta) of the bipolar transistor and reducing the breakdown voltage of the transistor. However, these solutions are not applicable when the bipolar transistor is intended for use in RF power applications. RF power applications require relatively low beta values with high breakdown voltage and high current carrying capability.

Accordingly, a need exists for a bipolar transistor for RF and other bipolar and/or MOS device applications requiring very high performance. It is desired for the device to have very high frequency, linear, rugged, low noise performance in high speed and/or high speed/high power communication applications and other applications requiring high speed and high frequency performance. It is also desired that inherent bipolar device parasitics be reduced to near theoretical minimums resulting in low noise and distortion products, maximum efficiencies, high linearity, and high power gains.

BRIEF DESCRIPTION OF THE DRAWINGS

The invention will be better understood from a reading of the following detailed description taken in conjunction with the accompanying drawing, in which like reference indicators are used to designate like elements in the various drawing figures, and in which:

FIGS. 3 through 11 illustrate enlarged cross-sectional views of various stages of fabrication of the transistor in FIG. 2 in accordance with the invention.

It will be appreciated that for simplicity and clarity of illustration, elements illustrated in the figures have not necessarily been drawn to scale. For example, the dimensions of some of the elements are exaggerated relative to other elements for clarity.

DETAILED DESCRIPTION OF THE DRAWINGS

Figure 1:
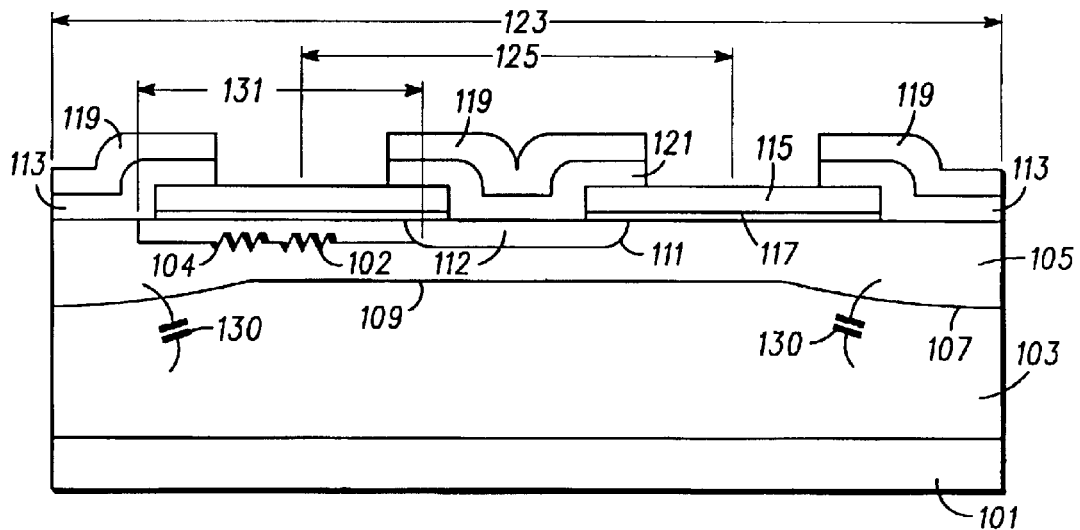
FIG. 1 illustrates an enlarged cross-sectional view of a prior art RF bipolar unit cell of a transistor.

FIG. 1 illustrates an enlarged cross-sectional view of a unit cell of a prior art sub-micron radio frequency transistor 100. The transistor 100 is bipolar and is described hereinafter in an NPN configuration, which means that the transistor 100 has a collector region and an emitter region 112 that are of n-type conductivity and are controlled by a base region that is of p-type conductivity. This is not intended as a limitation because, as those skilled in the art will appreciate, a PNP configuration can be achieved by converting p-type regions to n-type regions and vice versa.

The starting material of the fabrication process for transistor 100 is typically an n-type silicon substrate layer 101. An epitaxial growth process forms an epitaxial layer 103 over the substrate layer 101 that, like the substrate layer 101, is n-type. The n-type epitaxial layer 103 has low, variable resistivity and will vary in thickness and doping to obtain whatever resistivity is required for performance characteristics of a particular application. The epitaxial layer 103 acts as an intrinsic collector of the transistor 100, and the bottom surface of the substrate layer 101 serves as the external contact terminal to the transistor 100.

A base region 105 is formed within the epitaxial layer 103 by doping the top portion of the epitaxial layer 103 to p-type conductivity. The base region 105 consists of two different regions: a base enhancement region 107 and an active base region 109. The base enhancement region 107 is immediately adjacent to the active base region 109, but has a different doping concentration. The base enhancement region 107 is higher in doping concentration than the active base region 109 and would usually be considered p+.

An emitter 111 is formed at the top of the epitaxial layer 103, in the center of the base region 105 in accordance with FIG. 1. The emitter 111 has a doping type opposite that of the base region 105, typically n-type with the base region 105 being p-type, and usually has a high concentration, n+. It is well known that the emitter region 112 should not be intentionally doped with p-type dopant, as this increases the capacitance of the emitter 111 and degrades the performance of the transistor 100. A thin oxide dielectric layer 117 is patterned over the base region 105 and the emitter 111. A first nitride layer 115 is then patterned over the dielectric layer 117, or more likely, both the dielectric layer 117 and the first nitride layer 115 will be patterned after the deposition of the first nitride layer 115. A polysilicon deposition and patterning forms both a base contact region 113 and a center region 121, which is an emitter polysilicon cap. However, while the base contact region 113 is doped p-type, the center region 121 is doped n-type in order to provide variable performance characteristics for a particular application. A top nitride layer 119 is deposited over base contact region 113 and center region 121. The base contact region 113, the center region 121 and the top nitride layer 119 are then etched to the first nitride layer 115 in accordance with the illustration in FIG. 1.

The base current flows through the low and high resistance regions of the base region 105. The resistance of the base enhancement region 107, represented by a resistor 104, is significantly lower than the resistance of the active base region 109, represented by a resistor 102. The total base resistance across a distance 131 is equal to the sum of the high resistance value of resistor 102 of the active base region 109 and the lower value resistance of resistor 104 of the base enhancement region 107. One objective of the present invention is to reduce the total base resistance of transistor 100. The base-to-collector capacitance of transistor 100, as illustrated by a capacitor 130, is non-linear. Another objective of the invention is to provide a bipolar transistor with a linear base-to-collector capacitance.

From the center of the base contact region 113 of one transistor to the center of the base contact region 113 of the same transistor, as indicated by a distance 123, is typically 3.2 micrometers. To reduce the junction capacitance, another objective of the invention is to reduce the distance 123 by half, as indicated by distance 125, thereby reducing the base-to-collector capacitance 130.

Figure 2:
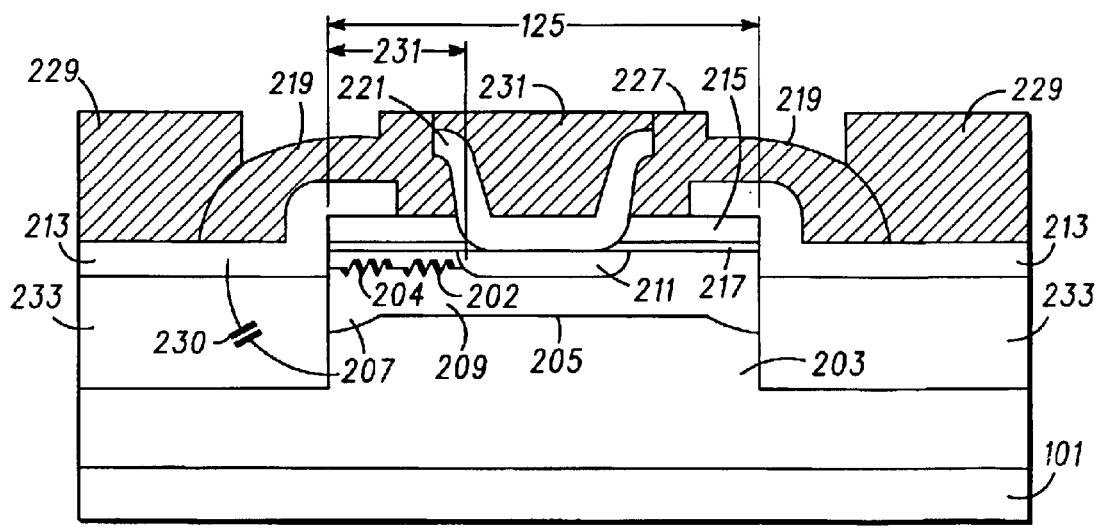
FIG. 2 illustrates an enlarged cross-sectional view of a bipolar transistor in accordance with the invention.

FIG. 2 illustrates an enlarged cross-sectional view of a sub-micron radio frequency bipolar transistor 200 that is an improvement over the transistor 100 illustratively embodied in FIG. 1. As explained hereinafter, transistor 200 includes silicon dioxide refilled trenches for base-to-collector capacitance reduction and a polysilicon layer for base resistance reduction while maintaining the base terminal-to-base terminal pitch.

The transistor 200 contains the substrate layer 101 covered by an epitaxial layer 203. A p-type base region 205 is located within the epitaxial layer 203. The base region 205 consists of a base enhancement region 207 and an active base region 209. An emitter region 211 of opposite conductivity type than the base region 205 is located at the top of the epitaxial layer 203 and in the top, center portion of the base region 205. The emitter region 211 is typically n-type, and usually has a high concentration, n+. A nitride region 215 overlays a dielectric region 217 and connects to a top nitride 219. In the preferred embodiment, the dielectric is a thin oxide. A first polysilicon layer forms a base contact region 213, and a second polysilicon layer forms an emitter polysilicon cap 221. The dielectric region 217 covers the base region 205. In this transistor 200, the base region 205 and the emitter region 211 are metallized as indicated by a base metal region 229 and an emitter metal region 231, respectively. A nitride layer 227 overlays a portion of the emitter polysilicon cap 221 and is coupled to the nitride region 215 that is directly above the dielectric region 217.

One solution for reducing and linearizing the base-to-collector capacitance of the prior art is by using silicon dioxide refilled moats or trenches that are partially filled with base polycrystalline silicon (polysilicon). Adjacent to the n-type epitaxial layer 203 are trenches 233 filled with dielectric. Using a field oxide for the dielectric, the net effect is that 50% of the base-to-collector junction capacitance 130 in transistor 100 of FIG. 1 is removed and replaced with a polysilicon-oxide-monosilicon capacitance that is represented by a capacitor 230 in FIG. 2 that is much lower in value per unit area. The polysilicon-oxide-monosilicon capacitor 230 has the additional benefit of a linear voltage characteristic. The non-linearity of the base-to-collector capacitor 130 in the transistor 100 of FIG. 1 is a limiting effect in RF performance in distortion.

In FIG. 2, the dielectric-filled trenches 233 abut the monosilicon base region 205 to allow current to flow laterally from the base contact region 213 through a small base enhancement region 207 and through the active base region 209 to the emitter region 211. A buried base contact, such as base contact region 213, allows lateral base contact that minimizes base resistance as represented by resistors 202, 204. The resistance of base resistors 202, 204 is reduced from the high base resistance of the analogous prior art base resistors 102, 104 in FIG. 1 by shortening the distance 131 (FIG. 1) the current flows through between the base contact region 113 (FIG. 1) and the emitter region 111 (FIG. 1). The distance 231 in FIG. 2 between the base contact region 213 and the emitter region 211 is reduced from the distance 131 (FIG. 1) in the prior art from approximately 1.0 micrometers to approximately 0.3 micrometers.

The reduced base-to-collector capacitance 230 and internal base resistance 202, 204 of transistor 200 embodied in FIG. 2 constitute improvements over transistor 100 embodied in FIG. 1. These improvements in device parameters should allow the device to operate in a higher frequency spectrum. The replacement of the non-linear base-to-collector capacitance 130 in FIG. 1 with a linear base-to-collector capacitance 230 in FIG. 2 is an improvement as well.

Figure 3:
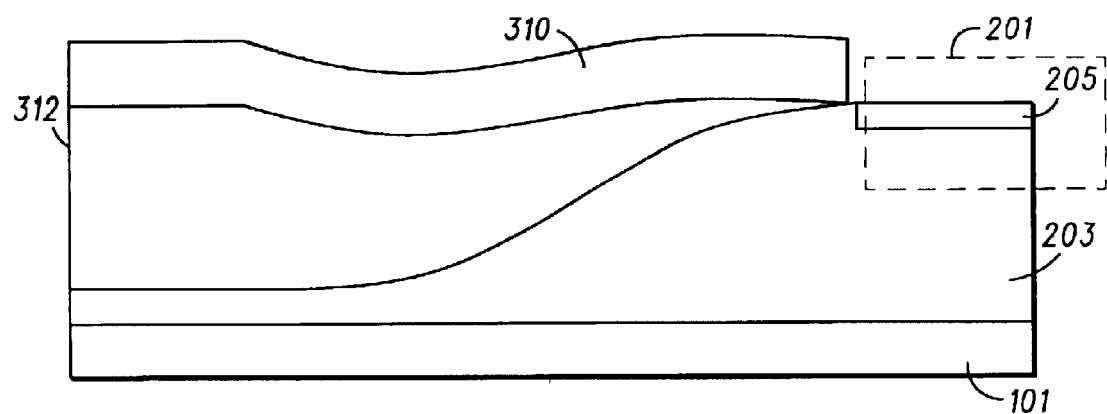

FIG. 3 illustrates a cross-sectional view of transistor 200 during an initial stage of the fabrication process. FIG. 3 illustrates a larger portion of transistor 200 than illustrated in FIG. 2. A dashed box 201 represents the portion of transistor 200 illustrated in FIG. 2. Epitaxial layer 203 is grown on top of the substrate layer 101 and acts as a collector in the transistor 200. A field oxide 312 is grown on the epitaxial layer 203, and a photoresist pattern 310 is used to define an area for a p-type implant into the epitaxial layer 203 to form the base region 205. As an example, field oxide 312 can be formed using a high pressure oxidation process.

Figure 4:
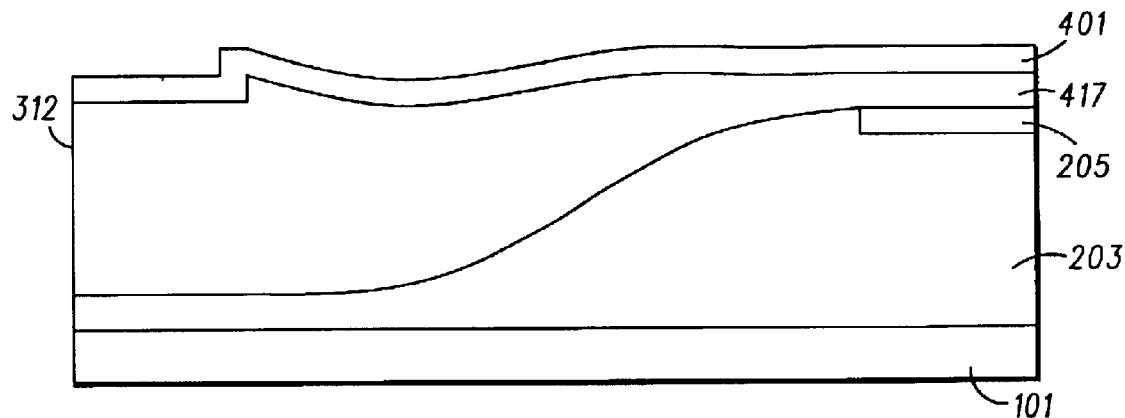

FIG. 4 illustrates a cross-sectional view of the transistor 200 after subsequent processing steps. A screen oxide 417 covers the epitaxial layer 203, and the screen oxide 417 is then covered by a nitride layer 401. The base region 205 is annealed to complete the process. In the annealing process, the substrate layer 101 is heated to approximately 900 to 950 degrees Celsius for approximately 30 to 60 minutes in an inert ambient.

Figure 5:
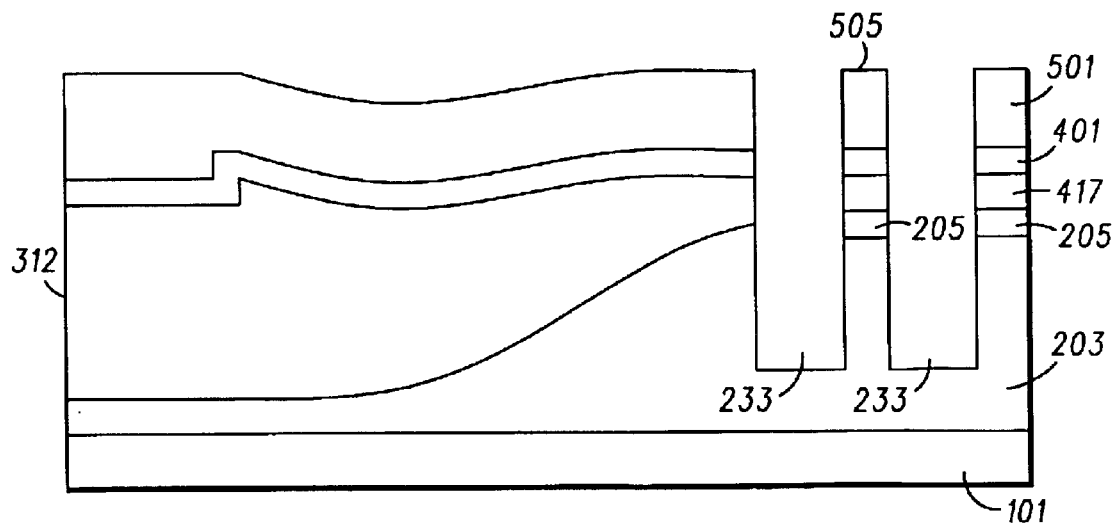

FIG. 5 illustrates a cross-sectional view of the transistor 200 after a continuation of processing steps. An additional photoresist layer 501 is formed on top of the nitride layer 401. The nitride layer 401 and the screen oxide 417 are etched through, and trenches 233 are etched into the epitaxial region 203 to an appropriate depth. As an example, the trenches may be extended all the way to the low resistivity portion of the substrate layer 101 if needed for certain performance characteristics. The trenches 233 are subsequently filled with oxide or another appropriate dielectric. Transistor 200 preferably contains several trenches 233 that define pedestals 505 comprised of portions of the epitaxial layer 203, the screen oxide 417, and the nitride layer 401.

Figure 6:
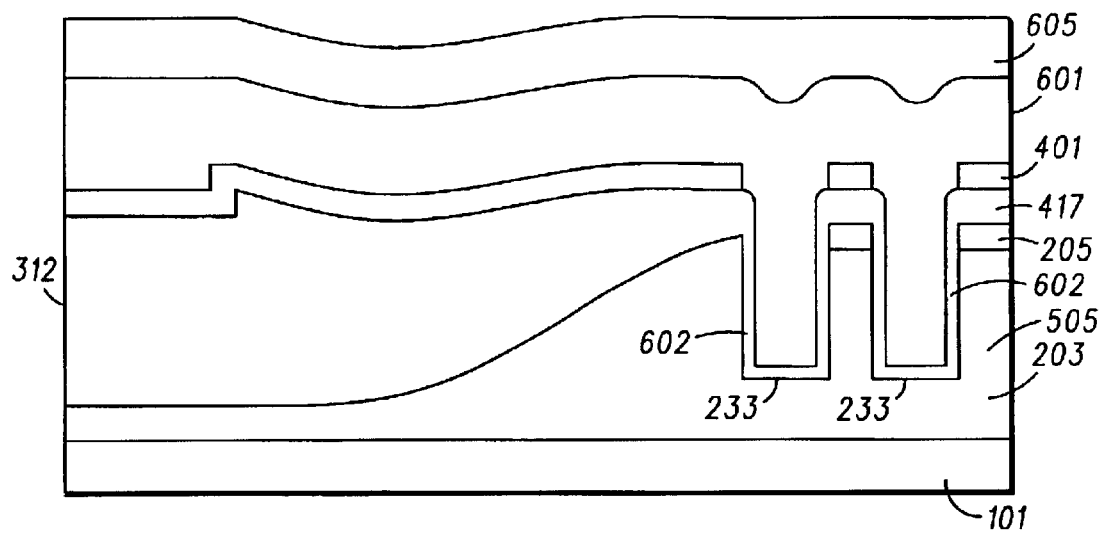

FIG. 6 illustrates a cross-sectional view of the transistor 200 after additional processing. The photoresist layer 501 in FIG. 5 is removed and a thin thermal oxide layer 602 is grown in the trenches 233. Then the trenches 233 are filled with a dielectric 601, such as a field oxide, to provide the appropriate capacitance and resistance characteristics. The dielectric 601 fills in and covers the trenches 233. A layer of photoresist 605 is then spun to give a smooth top for a planarization process.

Figure 7:
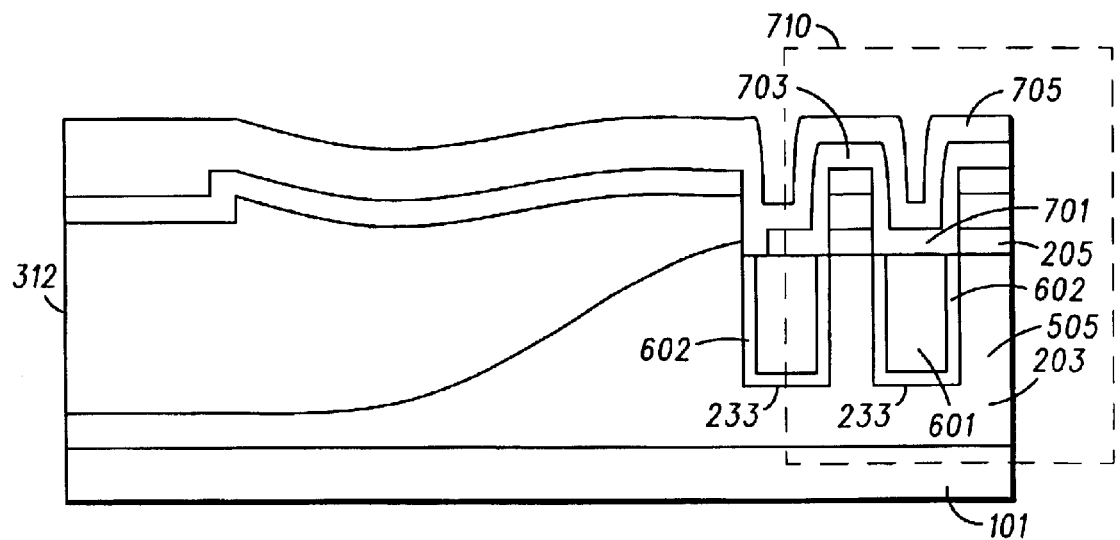

FIG. 7 illustrates a cross-sectional view of transistor 200 after further processing steps. After the planarization process, the dielectric-filled trenches 233 are etched a small distance to create trench recesses 701. In the trench recesses 701, a layer of polysilicon 703 is deposited and then doped by an implant process. Resistors (not shown) may also be implanted into the polysilicon layer 703, if desired, to be used in conjunction with the device. A second implant can be used to form the resistors. An additional single photoresist process can be used to define where to etch the polysilicon layer 703. In FIG. 7, the etched polysilicon extends from the left end trench over to the opposite end of transistor 200. After the photoresist removal, the polysilicon layer 703 is capped by a top layer of nitride 705.

FIG. 8 illustrates a cross-sectional view of transistor 200 after subsequent processing steps. FIG. 8 illustrates a different portion of transistor 200 than illustrated in FIG. 7. A dashed box 710 in FIG. 7 represents the portion of transistor 200 illustrated in FIG. 8. In particular, FIG. 8 shows two pedestals 505 and three trenches 233 with trench recesses 701. The area for an emitter window 801 is defined, and the emitter window 801 is dry etched through the top nitride layer 705, the polysilicon layer 703, and the nitride layer 401 to the screen oxide 417. At least a portion of the screen oxide 417 is preserved underneath the emitter window 801.

FIG. 9 illustrates a cross-sectional view of transistor 200 after further processing steps. FIG. 9 illustrates an embodiment of emitter windows 801 of transistor 200 with the addition of nitride spacers. A thin second nitride layer 901 is deposited, preferably uniformly on all surfaces horizontal and vertical, over the top nitride layer 705. The purpose of the second nitride layer 901 is to cover any exposed portions of the polysilicon layer 703 as well as to reduce the width of the emitter window 801. A typical emitter window 801 may be reduced from a width of approximately 0.9 micrometers to approximately 0.6 micrometers. The nitride layer 901 is subsequently removed from horizontal surfaces, but is left on vertical surfaces through a reactive ion etching (RIE) process. An RIE process is preferred because it can remove nitride from the horizontal surfaces while leaving it on the vertical surfaces to reduce the emitter window width. The screen oxide 417 is then wet etched to expose the underlying epitaxial layer 203.

Figure 10:
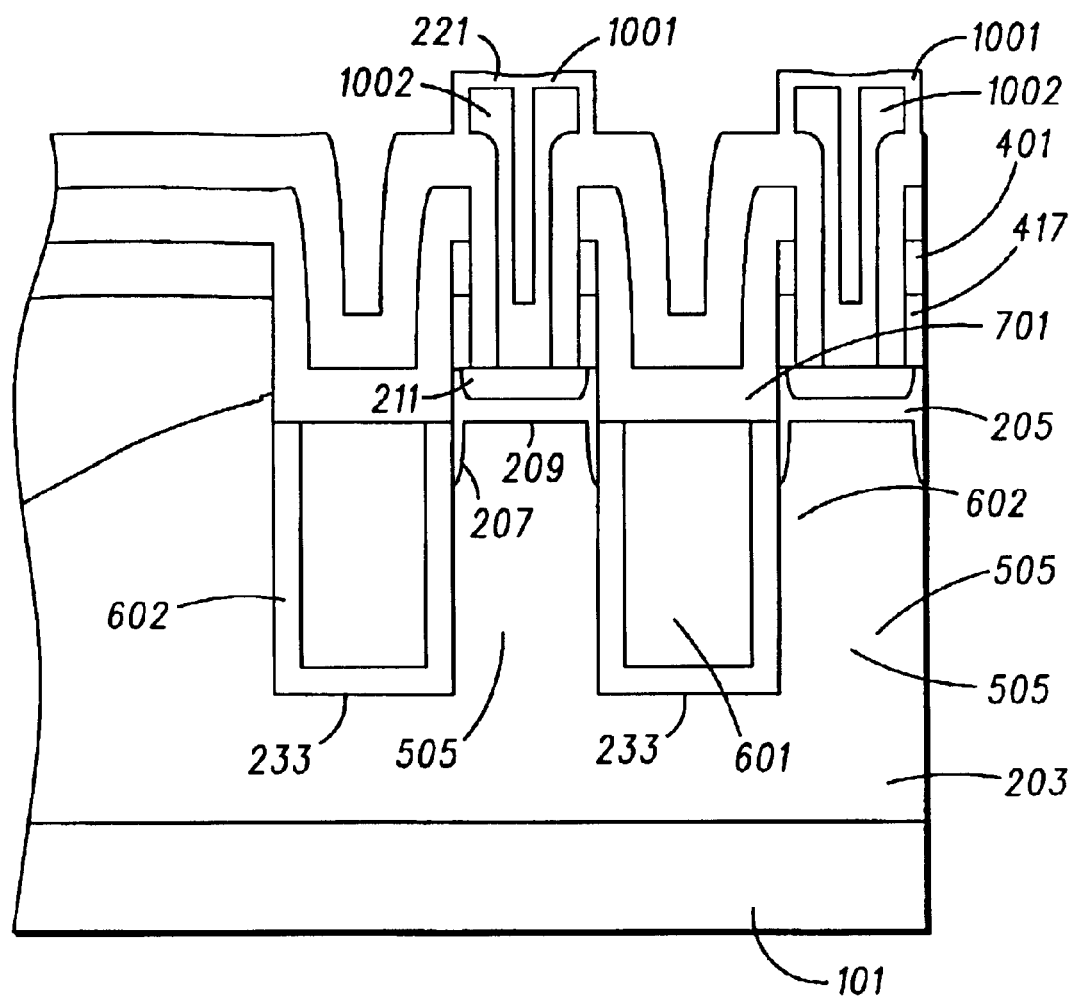

FIG. 10 illustrates a cross-sectional view of the transistor 200 after additional process steps. A dashed box 910 in FIG. 9 represents the portion of transistor 200 illustrated in FIG. 10, which isolates one pedestal 505. An emitter polysilicon layer 1002 is deposited across the entire transistor. After the deposition, the emitter polysilicon layer 1002 is implanted with an n-type dopant. A photoresist process is then performed to define the emitter polysilicon cap 221. The exposed polysilicon is etched away, leaving only the emitter polysilicon cap 221. After the photoresist removal, the emitter polysilicon cap 221 is then covered by a nitride layer 1001, and the device is annealed, diffusing dopant out of the emitter polysilicon cap 221 into the epitaxial layer 203 to form the emitter region 211 beneath the emitter polysilicon cap 221. The anneal also forms the base enhancement region 207 by diffusing dopant out of the polysilicon layer 703 into the epitaxial layer 203.

Figure 11:
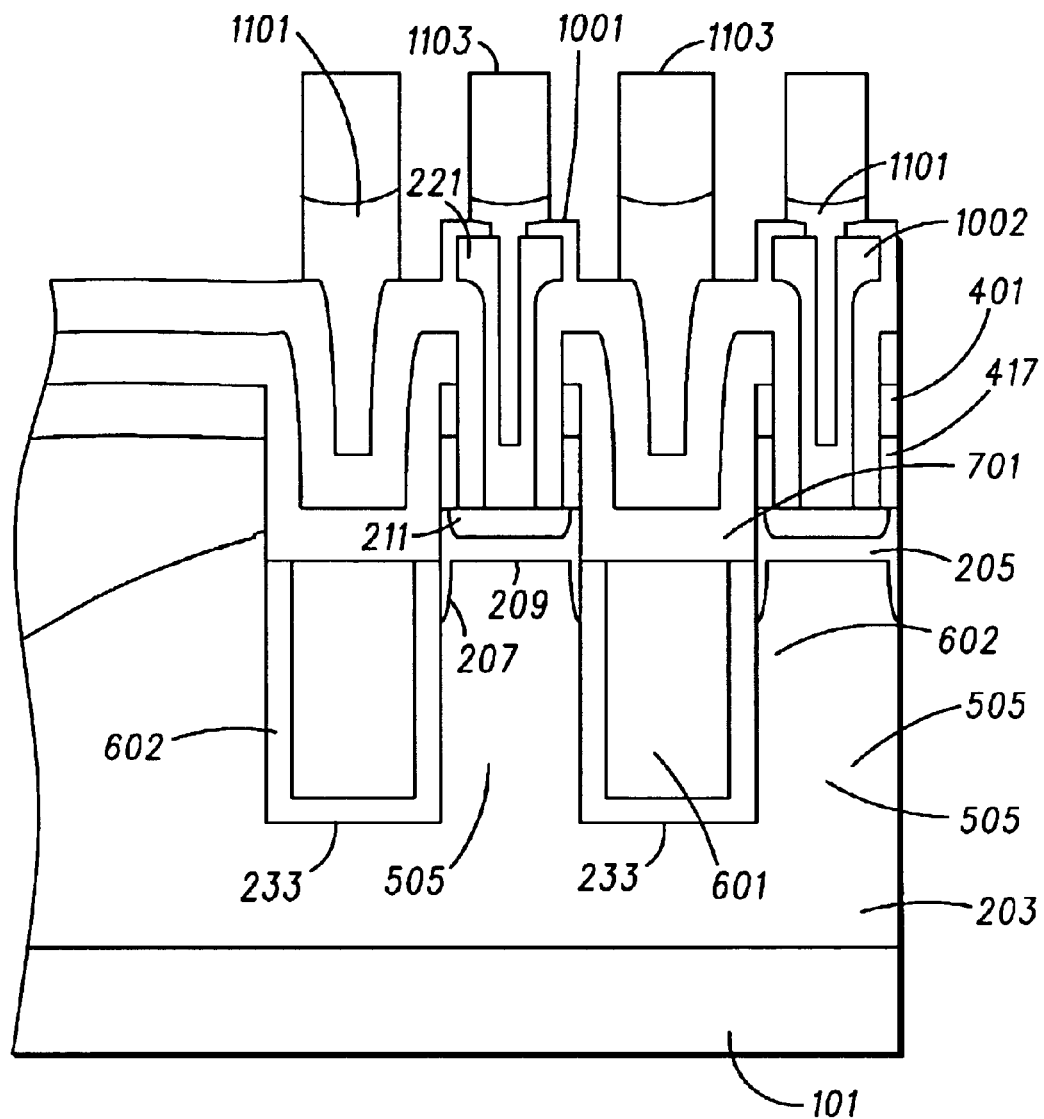

FIG. 11 illustrates a cross-sectional view of the transistor 200 after additional process steps through metallization. FIG. 11 expands the view of transistor 200 from one pedestal in FIG. 10 back to two pedestals in FIG. 11. A base opening 1105 in nitride layers 705 and 1001 and an emitter opening 1107 in the nitride layer 1001 are filled with a barrier metal 1101. The barrier metal 1101 illustrated in FIG. 11 is titanium tungsten. On top of the barrier metal 1101, a metallization for standard RF devices is performed in which a conductor layer 1103 covers the barrier metal 1101. The metallization may be a single layer or a sequence of layers made from materials such as gold, copper, aluminum, titanium tungsten, nickel, or the like. A photoresist defines the metal lines, and the conductor layer 1103 and the barrier metal 1101 are etched to form the base metal region 229 and the emitter metal region 231, both shown in FIG. 2. A standard passivation (not shown) can be used to protect the component parts of the semiconductor device.

Although certain embodiments have been disclosed herein, it will be apparent to those skilled in the art that variations and modifications of such embodiments may be made without departing from the spirit and scope of the invention. Accordingly, it is intended that the invention shall be limited only to the extent required by the appended claims.

What is claimed is:

1. A method of manufacturing a semiconductor device having a bipolar transistor comprising:

provicing a substrate of a first conductivity type;

providing an epitaxial layer of the first conductivity type overlying the substrate;

providing an oxide layer overlying the epitaxial layer;

implanting dopants of a second conductivity type different from the first conductivity type to form a base region within the epitaxial layer;

providing a nitride layer overlying the oxide layer;

etching first and second trenches through the nitride layer, the oxide layer, the base region and into the epitaxial layer to form a pedestal collector region within the epitaxial layer disposed between the first and second trenches;

depositing a dielectric into the first and second trenches to fill the first and second trenches;

etching recesses in the dielectric within the first and second trenches, the recesses extending below a top surface at the epitaxial layer proximate the base region; and depositing polysilicon of the second conductivity type into the recesses, wherein the polysilicon acts as a dopant source upon an anneal of the semiconductor device to form a base enhancement region at opposite sides of the base region by diffusing dopants out of the polysilicon and into the base region.

* * * * *